United States Patent [19]
Marino et al.

[11] Patent Number: 5,177,447
[45] Date of Patent: Jan. 5, 1993

[54] AUTOMATED BREAKOUT BOX FOR AUTOMOTIVE TESTING

[75] Inventors: Joseph A. Marino, Waukesha; Raymond H. Niemetschek, Brookfield, both of Wis.

[73] Assignee: Bear Automotive Service Equipment Company, New Berlin, Wis.

[21] Appl. No.: 610,213

[22] Filed: Nov. 6, 1990

[51] Int. Cl.⁵ .................. G01R 27/08; F02P 17/00
[52] U.S. Cl. .................. 324/713; 324/503; 324/384; 324/378; 364/431.01; 364/424.03
[58] Field of Search ............ 324/66, 384, 378, 402, 324/503, 540, 691, 609, 610, 713, 715, 704; 73/117.2, 116; 364/483, 482, 431.02, 431.01–431.03, 424.03

[56] References Cited

U.S. PATENT DOCUMENTS

| | | | |
|---|---|---|---|
| 2,710,375 | 6/1955 | Mengali | 324/713 |
| 4,757,463 | 7/1988 | Ballou et al. | 364/551 |

OTHER PUBLICATIONS

Service Bulletin, "Vehicle System Test", Ford Granada '85–Scorpio: Section 290, Feb. 1985.
EDN Magazine, Mar. 15, 1990 "Analog Switches & Multiplexers" by Doug Conner.
Machine Design Magazine, Sep. 7, 1989 by Hauge et al. entitled "How to Avoid ADC Errors in Microvolt Signals".
Evaluation Engineering Magazine, May 1990 by Paul O'Shea entitled "Continuity/Bare-Board Testing".
EDN Magazine Feb. 16, 1989 by Anne Watson Swager entitled "Crosspoint Switch ICs Enter Digital Domain".

Primary Examiner—Jack B. Harvey
Attorney, Agent, or Firm—Kinney & Lange

[57] ABSTRACT

An automated test system makes voltage and resistance measurements. The breakout cable is connected between the vehicle electronic control module and the vehicle sensors and controls. Resistance measurements are made between a selected pair of connector pins of the breakout cable by connecting a current loop (which includes a power supply and a known resistance) through a first multiplexing circuit to the selected pair of pins. A voltage measuring circuit measures voltage across the known resistance and between the pair of pins. The voltage measuring circuit includes a second multiplexing circuit and a voltmeter. The second multiplexing circuit receives inputs from the various pins, as well as from opposite sides of the known resistance in the current loop. The second multiplexing circuit provides its output to the voltmeter for measurement. By measuring the voltage across the known resistance, and the voltage between the selected pair of pins, the resistance between the two pins can be derived.

16 Claims, 3 Drawing Sheets

AUTOMATED BREAKOUT BOX FOR AUTOMOTIVE TESTING

BACKGROUND OF THE INVENTION

The present invention relates to an automated automotive test system. In particular, the present invention is an automated breakout box for performing test sequences on electrical systems of an automotive vehicle which include voltage and resistance measurements.

With the advent of integrated circuits, and with the increasing use of sophisticated electronic, electric and electromechanical sensors and control systems in automobiles, the testing and servicing of automobiles has presented ever-increasing challenges. At the present time, many tests of electrical systems, sensors and components of an automobile are made manually by a technician who unplugs a multipin connector between the vehicle's electronic control module (ECM) and the vehicle sensors and controls. The technician makes voltage and resistance measurements between various pins of the connector using a multimeter. The technician making those measurements is required to move the multimeter probe to appropriate measurement points. It is also necessary to set the multimeter to the proper measuring formula, such as volts or ohms.

This manual testing procedure has many drawbacks. In particular, the technician must follow detailed instructions in order to perform the proper tests. The instructions require that the technician set the proper condition, select the proper test points, read the equipment properly, and compare the reading to the listed tolerances specified in the instructions.

Some test systems have been developed which simplify some of the test operations. These devices use selection switches to select the proper test points. While this helps to some extent, the technician is still required to use the instructions, set the multimeter, and compare readings to the listed tolerances for that measurement.

The Ballou et al. U.S. Pat. No. 4,757,463 describes a computerized automotive vehicle diagnostic system in which a multiconductor probe cable is connected between the ECM and the vehicle sensors and controls. This cable is connected to a programmable cross-point switch, which is controlled by a microcontroller. The cross-point switch is controlled to connect a multimeter, a voltage source and a ground selectively to points in order to perform a sequence of tests. These can include reading resistance, reading voltage, reading a pulse width modulated signal and reading the time in between two pulses.

As the number of electrical systems and sensors increase, the number of possible combinations of points which need testing increases as well. An automated breakout box, therefore, would preferably make use of solid state switching devices to make connections between the testing circuitry and the points to be tested. Solid state multiplexers are available which are capable of selecting among a large number of different inputs or outputs. A solid state multiplexer offers significant advantages in size, cost and reliability over a multiplexer which makes use of electromechanical relays.

The problem with solid state multiplexers, however, is the internal resistance of the multiplexers in the ON state--which can typically be 75 ohms, and which varies with temperature, humidity, and other factors. In comparison, the contact resistance in electromechanical relay is much less, and is not affected to the same extent by temperature or humidity.

In certain applications, the internal resistance of solid state multiplexers is not a factor. For example, in reading voltages, solid state multiplexers do not introduce a significant error, because the voltage measuring devices require high impedance input circuits (typically 10 megohms input impedance), and therefore the internal resistance of the multiplexers does not affect accuracy of a voltage reading. This is not the case, however, in measuring resistances of the type encountered in the typical automobile. Often, the internal resistance of a solid state multiplexer is much greater than the resistance to be measured. Measuring resistance of vehicle sensors and other control components requires the ability to make very precise resistance readings down to very low values (on the order of a few ohms). These readings must also be made at low current levels, so that the test current being used does not damage the circuitry or components during the testing procedure.

The use of relays in a multiplexer overcomes the problem of internal resistance, but has other disadvantages. For example, with a 60-channel multiplexer (i.e., which is required to make measurements between 60 pairs of contact points), a minimum of 120 relays is required. The resulting multiplexer is bulky, costly and not as reliable as solid state multiplexers.

SUMMARY OF THE INVENTION

The present invention uses a first pair of multiplexers to connect a power supply and reference resistor to a selected pair of connector points, and a second pair of multiplexers to connect a voltage measuring circuit to the two connection points and to opposite sides of the reference resistor. By using separate multiplexers for the current supply circuit and the voltage measuring circuit, the effects of internal resistance of the multiplexers connected to the power supply is not a factor in the measurement of resistance. The present invention, therefore, allows solid state multiplexers to be used, rather than electromechanical relays, without affecting the accuracy of resistance measurements.

DETAILED DESCRIPTION OF THE PREFERRED EMBODIMENTS

Figure 1:
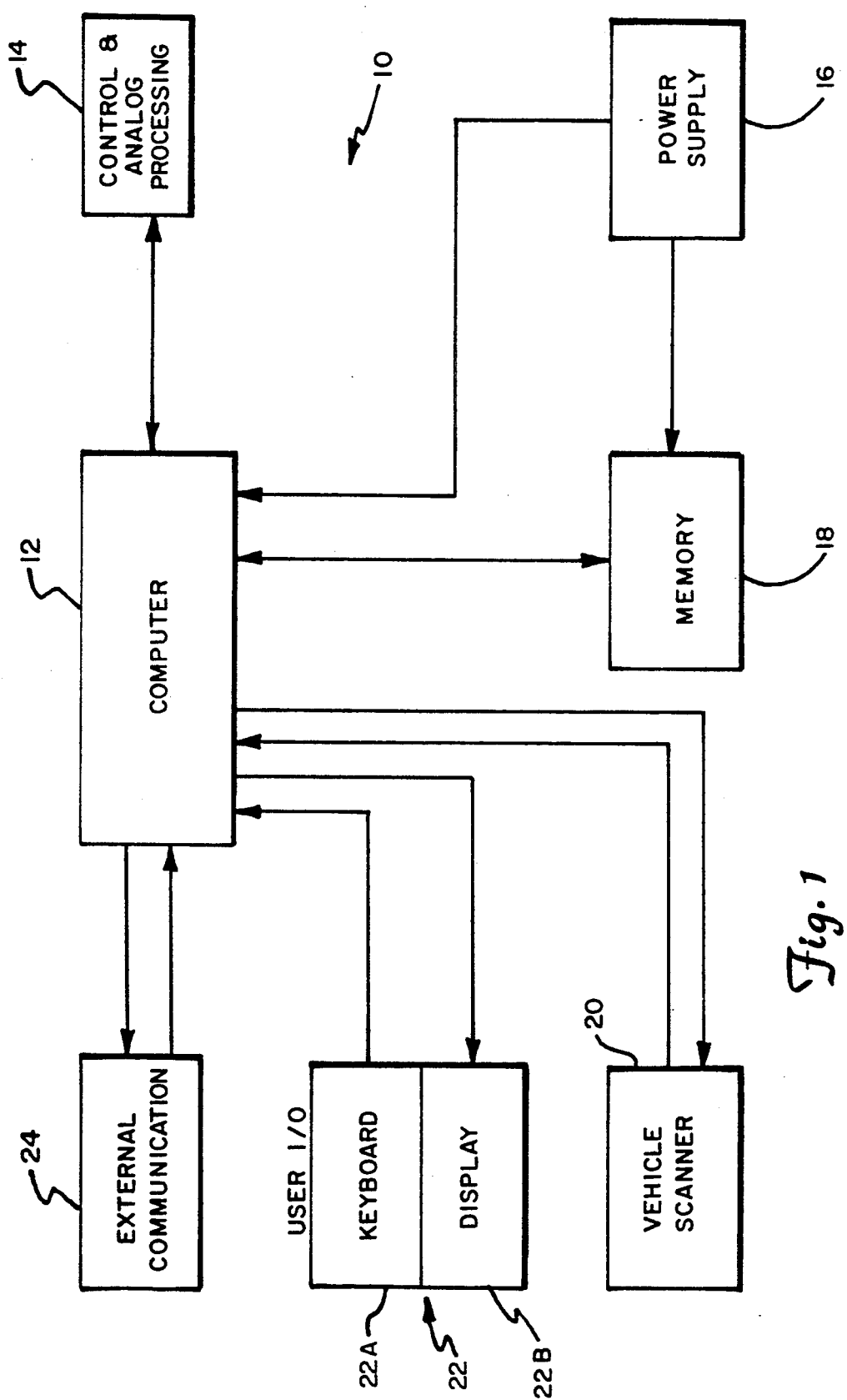
FIG. 1 is an electrical block diagram of an automated breakout box of the present invention.

FIG. 1 shows automated breakout box 10 of the present invention, which includes digital computer 2, control and analog processing circuitry 14, power supply 16, memory 18, vehicle scanner 20, user input/output 22 (which includes keyboard 22A and display 22B), and external communication circuitry 24. Automated breakout box 10 is connected to an automobile through control and analog processing circuitry 14, and performs sequential testing of a variety of different systems and components, such as the electronic control module (ECM) and related vehicle sensors and controls, the fuel injection system, instrument panel displays and indicators, and the anti-lock braking system (ABS).

Under the control of computer 12, automated breakout box 10 sets up the conditions for testing, does the test, records the test results, and supplies the test results to the operator/technician through the user display 22B to permit the results of the test to be reviewed.

Computer 12 is preferably a microprocessor-based computer system. Computer 12 provides control signals to control and analog processing circuitry 14 to set up circuitry 14 to make particular tests. In preferred embodiments of the present invention, circuitry 14 measures voltages, resistances, and pulse widths, and provides to computer 12 digital data which represents the measured values. As will be described in further detail with reference to FIGS. 2 and 3, control and analog processing circuitry 14 is capable of connection to the electrical system of an automobile, and can measure voltages and resistance between a large number of individual connector points.

Power supply 16 provides power to computer 12 and to memory 18.

Memory 18 preferably includes RAM, ROM, and EPROM storage for use by computer 12. The programs which operate computer 12 can be stored in memory 18. In addition, the specifications of the particular vehicle to be tested, including the particular pins to be accessed and the sequence of tests to be performed, is provided to computer 12 from memory 18. This allows the test to proceed automatically, without a need for the technician to read and follow a lengthy procedure in a printed manual. Because there are a large number of different vehicles, each with a unique set of connectors and test sequences, memory 18 preferably includes storage devices such as memory cards, memory cartridges, magnetic floppy disks, optical disks, or the like, which store all of the necessary information for a particular vehicle. Depending on the vehicle to be used, a selected storage device for that vehicle is inserted into memory 18, which includes an appropriate card reader, cartridge reader, disk drive or the like.

Vehicle scanner 20 is a device which can connect to a readout plug on a vehicle to obtain fault code information from the vehicle. For General Motors cars, the connector for fault code information is known as the ALDL connector. The fault code obtained by vehicle scanner 20 is supplied to computer 12, and is used to direct the testing to particular systems and components and to particular test sequences.

User I/O 22 preferably includes keyboard 22A and display 22B. The operator/technician provides information about the particular vehicle to be tested and the tests which are desired, and responds to prompts from computer 12 which are supplied to the display 22B.

As part of the automated testing procedure, information is supplied through display 22B to the operator/technician, indicating the test conditions which must be set. For example, in some tests the vehicle's ignition must be on, while in another test the ignition must be off. Similarly, some tests require that devices be moved (such as rotating the throttle plate to see if the resistance values are in the right range). Other tests require that the engine be running. Display 22B, under the control of computer 12, provides the necessary prompts and setup information to the operator/technician.

In addition, display 22B provides the operator/technician with the results of the test such as the test sequence number, the value read, the tolerance required by that particular test, and good or bad indication.

External communication circuitry 24 allows computer 12 to communicate with other computers and systems. In one preferred embodiment, external communication circuitry 24 includes CAN and RS232 communication capabilities.

Figure 2:
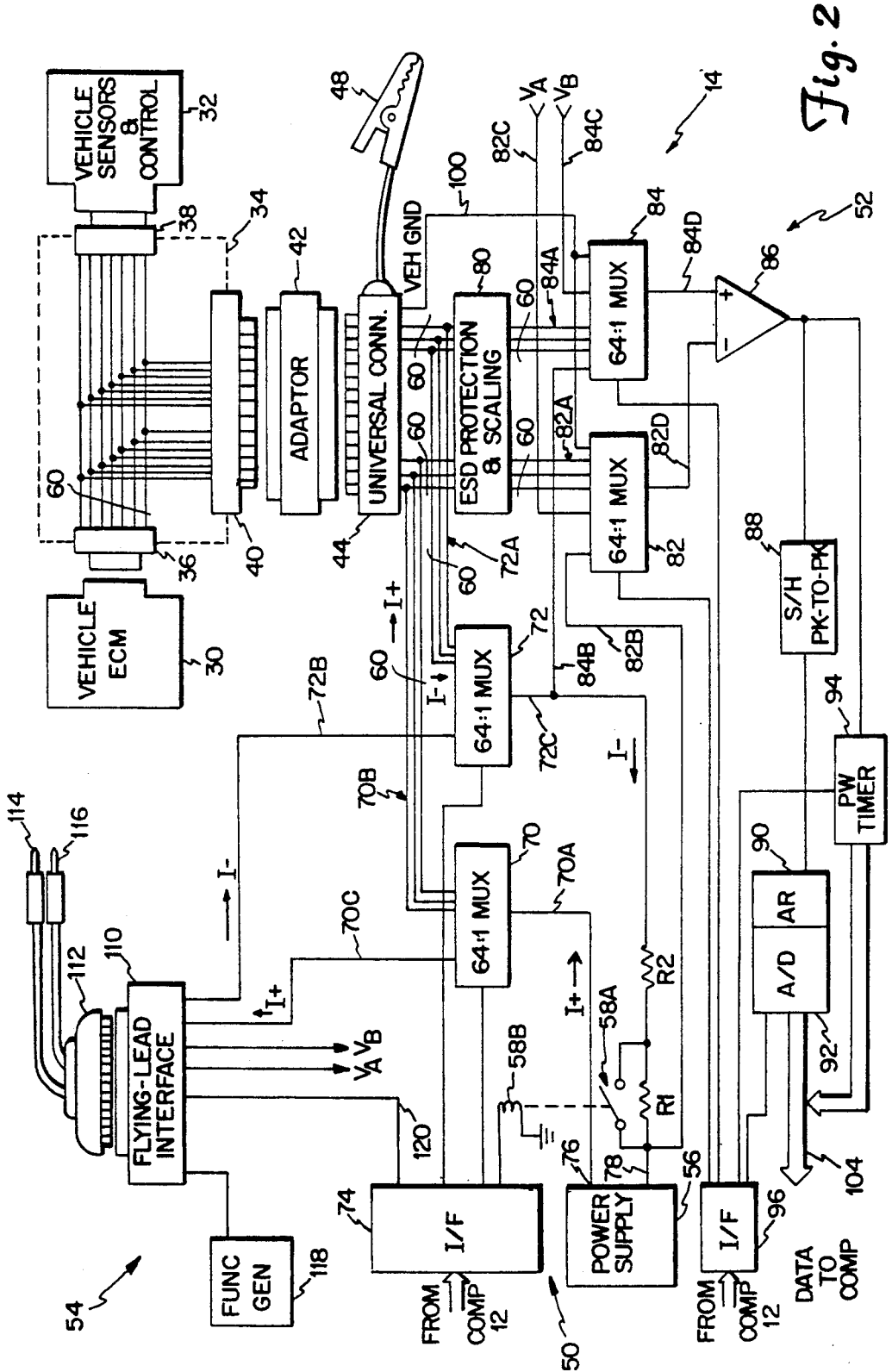
FIG. 2 is an electrical block diagram of the analog processing and control circuitry of the automated breakout box of FIG. 1.

FIG. 2 shows control and analog processing circuitry 14, which is used to make voltage and resistance measurements and to measure pulse width. In FIG. 2, vehicle ECM 30 and vehicle sensors and controls 32 are shown. Connection to ECM 30 and to vehicle sensors and controls 32 is made by breakout cable 34, which includes multipin connector 36 for connection to ECM 30, multipin connector 38 for connection to sensors and controls 32, and multipin connector 40 for connection to adaptor 42. The particular configuration of connector pins for vehicle ECM 30 and vehicle sensors and controls 32 will differ depending upon the manufacturer and in some cases the model of vehicle. Breakout cable 34 is one of several different cables available to the technician, and is arranged to mate with a particular manufacturer's ECM 30 and sensors and controls 32.

Adaptor 42 provides a connection between connector 40 of breakout cable 34 and universal multipin connector 44 of circuitry 14. The operator/technician has available a number of different breakout cables 34 and adaptors 42 to allow circuitry 14 to be used with a variety of different manufacturers' vehicles Universal connector 44 mates with adaptor 42, and provides the connection between the test circuits of control and analog processing circuitry 14 and the electrical system or component which is being tested. In one preferred embodiment of the present invention, universal connector 44 is a 120-pin connector which has a separate ground wire 46 and allegator clamp 48 for connection to vehicle ground.

Connected to universal connector 44 is resistance measuring current supply circuit 50 and voltage measuring circuit 52. Control and analog processing circuitry 14 also includes flying lead circuitry 54, which allows measurement between any two points independent of universal connector 44.

Current supply circuitry 50 includes power supply 56, precision resistors R1 and R2, relay contact 58A and relay coil 58B, multiplexers 70 and 72 and interface 74. In a preferred embodiment of the present invention, a power supply 56 is a constant current power supply which operates at about 10 volts and supplies a 10 milliamp constant current. Multiplexers 70 and 72 are 64:1 multiplexers.

The current I+ from terminal 76 of power supply 56 is supplied to input 70A of multiplexer 70. Based upon a control signal from interface 74, multiplexer 70 supplies current I+ to one of its outputs, which include sixty output lines 70B which are connected to connector 44 and output line 70C which is connected to flying lead circuitry 54. When cable 34 is being used, this causes current I+ to be steered to one of sixty different connection points through connector 44, adaptor 42, and cable 34. Return current I− from vehicle sensors and controls 32 is supplied through breakout cable 34 and connector 40 to adaptor 42 and then to universal connector 44. It is returned on one of sixty input lines 72A to multiplexer 72. Alternatively, return current is returned on input line 72B from flying lead circuit 54. Interface 74 supplies a signal to multiplexer 72 which selects one of the input lines 72A, 72B, and routes the return current I− through output line 72C to resistor R2. The return current I− flows through resistor R2 and through either resistor R1 or relay contacts 54, depending on whether shunt relay coil 58B is energized or de-energized. The return current I− then flows to terminal 78 of power supply 56.

Interface 74 receives signals from computer 12 and selects the particular connector to which and from which current is supplied by the resistance measuring current loop. Interface 74 also selects the range of operation by selecting whether resistor R1 will be connected in series with resistor R2 or will be shunted by relay contacts 58A. In one preferred embodiment of the present invention, R1 is a 100 K ohm resistor, while resistor R2 is a 200 ohm resistor.

Voltage measuring circuit 52 includes electrostatic discharge (ESD) protection and scaling circuitry 80, multiplexers 82 and 84, operational amplifier 86, sample/hold and peak-to-peak detector circuit 88, auto-ranging circuitry 90, analog-to-digital (A/D) convertor 92, pulse width timer 94, and interface circuit 96.

Multiplexers 82 and 84 are 64:1 multiplexers which receive a plurality of input lines, and provide one output line each. Sixty input lines 82A to multiplexer 82 are supplied through ESD protection and scaling circuit 80. These sixty input lines 82A are connected to the same sixty pins of connector 44 as output lines 70B of multiplexer 70. In addition, multiplexer 82 receives input line 82B, which is connected to terminal 78 of power supply 56. The VA output of flying lead circuitry 54 (which will be described in further detail later) is also supplied on input line 82C to multiplexer 82. Vehicle ground line 100 (which is connected to ground wire 46 and alligator clamp 48) is supplied as an input to multiplexer 82 and multiplexer 84.

Multiplexer 84 receives sixty input lines 84A from ESD protection and scaling circuit 80 which are connected to the same sixty pins of connector 44 as input lines 72A of multiplexer 72.

Multiplexer 84 also receives input line 84B which is connected to output line 72C of multiplexer 72. It also receives the VB output from flying lead circuitry 54 on input line 84C.

Multiplexers 82 and 84 are controlled by interface 96, which receives control signals from computer 12. Interface 96 also supplies control signals which determine whether A/D convertor 92 or pulse width timer 94 will be supplying data on lines 104.

Output lines 82D and 84D of multiplexers 82 and 84 are connected to the inverting (−) and non-inverting (+) inputs of operational amplifier 86, respectively. The output of operational amplifier 86 is supplied to both sample/hold and peak-to-peak detector circuit 88 and also to pulse width timer 94. The output of sample/hold and peak-to-peak detector circuit 88 is supplied to the auto-ranging circuitry 90 of A/D convertor 92. When A/D convertor 92 is selected by interface 96, it converts the analog voltage which receives at its input to a 12-bit digital value which is supplied on lines 104.

Pulse width timer 94, when selected by interface 96, receives the output of operational amplifier 86 and times the pulse width of the signal received. The measured pulse width is supplied as digital data on lines 104 to computer 12.

Flying lead circuitry 54 includes flying lead interface 110, connector 112, and a pair of probes 114 and 116. Function generator 118 is also connected to flying lead interface 110.

Interface 74 provides a general purpose control line 120 which selects operation through flying lead circuit 54, rather than through breakout cable 34, adaptor 42, and universal connector 44. When selected, flying leads probes 114 and 116 are used to contact selected leads or pins. Various voltage and resistance measurements can be made which are similar to the measurements made through cable 34. Resistance measurements current is provided to and from flying lead interface 110 through lines 70C and 72B which are connected to multiplexers 70 and 72, together with voltage output lines 126 and 128 which supply the VA and VB output voltages to multiplexers 82 and 84.

Voltage measurements are made by circuit 14 through the use of voltage measuring circuitry 52. Computer 12 selects, through interface 96, the two connector points of universal connector 44 which are to be connected to A/D convertor 92. This selection is done through multiplexers 82 and 84. The output voltages from multiplexers 82 and 84 are supplied on lines 82D and 84D to operational amplifier 86, and through sample/hold and peak-to-peak detector circuitry 88 and auto-ranging circuitry 90 to the input of A/D convertor 92.

If additional voltages are to be measured, computer 12 changes the control signals supplied to interface 96, which causes multiplexers 82 and 84 to select other pins for connection to operational amplifier 86.

The same voltage measurements can be made through flying lead circuit 54. Interface 74 provides a control signal on line 120 to flying lead interface 110. The VA and VB voltages supplied on input lines 82C and 84C of multiplexers 82 and 84, and are connected to output lines 82D and 84D and thus to the inputs of operational amplifier 86.

When resistance measurements are to be made, both current supply circuit 50 and voltage measuring circuit 52 are active. Normally, breakout cable 34 will be connected only to vehicle sensors and controls 32 during a resistance measurement test. This avoids having a component within the vehicle ECM affecting the resistance measurement. During a voltage measurement, on the other hand, both ECM 30 and vehicle sensors and controls 32 are normally connected to breakout cable 34.

Power supply 56, which is preferably a constant current source providing current at a level of about 10 milliamps and nominally about 10 volts, supplies current I+ through multiplexer 70 to one of the sixty lines 70B to connector 44. The return current I− is supplied from connector 44 to one of the sixty input lines 72A of multiplexer 72, and then from output line 72C through one or both the resistors R1 and R2. Computer 12 selects, through interface 74 and shunt relay coil 58B, whether resistor R1 will be shunted by contacts 58A.

When the resistance measuring mode is first selected, multiplexers 82 and 84 are controlled to connect the selected two pins of connector 44 to the inputs of operational amplifier 86. A1 this time, current is not yet being supplied through multiplexers 70 and 72, and therefore no voltage should appear between the + and − inputs of operational amplifier 86. If a voltage does appear, the data on lines 104 to computer 12 will indicate the presence of the non-zero voltage, and computer 12 will stop and provide a message through display 22B. Computer 12 will not allow a resistance measurement to continue until the operator/technician supplies an input through keyboard 22A indicating that the condition has been corrected. Typically, this situation will occur because ECM 30 has not been disconnected from breakout cable 34.

If no voltage appeared on the selected pins, computer 12 will instruct multiplexers 70 and 72 to select the same two pins which are selected by multiplexers 82 and 84. Circuitry 14 is then ready to perform the resistance check.

Multiplexers 82 and 84 are instructed to set measuring points to lines 82B and 84B. The voltage reading between these two lines represents the voltage across resistors R1 and R2. Since the resistance between lines 82B and 84B is known (i.e., either R1+R2 of just R2) the voltage reading which is obtained provides an indication of the current which is flowing through the current loop.

Computer 12 then instructs multiplexers 82 and 84 to read the voltage across the pre-selected pins. Since the current was known by the previous measurement, computer 12 is able to derive the resistance by measuring the voltage between the two pins and dividing that voltage by the current which had just been read.

This method allows the reading of very small resistances very accurately. The internal resistances of multiplexers 70, 72, 82 and 84 do not affect the accuracy of the measurement. As a result, the present invention allows the use of solid state multiplexers which are substantially lower cost, more reliable, and more compact than relays.

Figure 3:
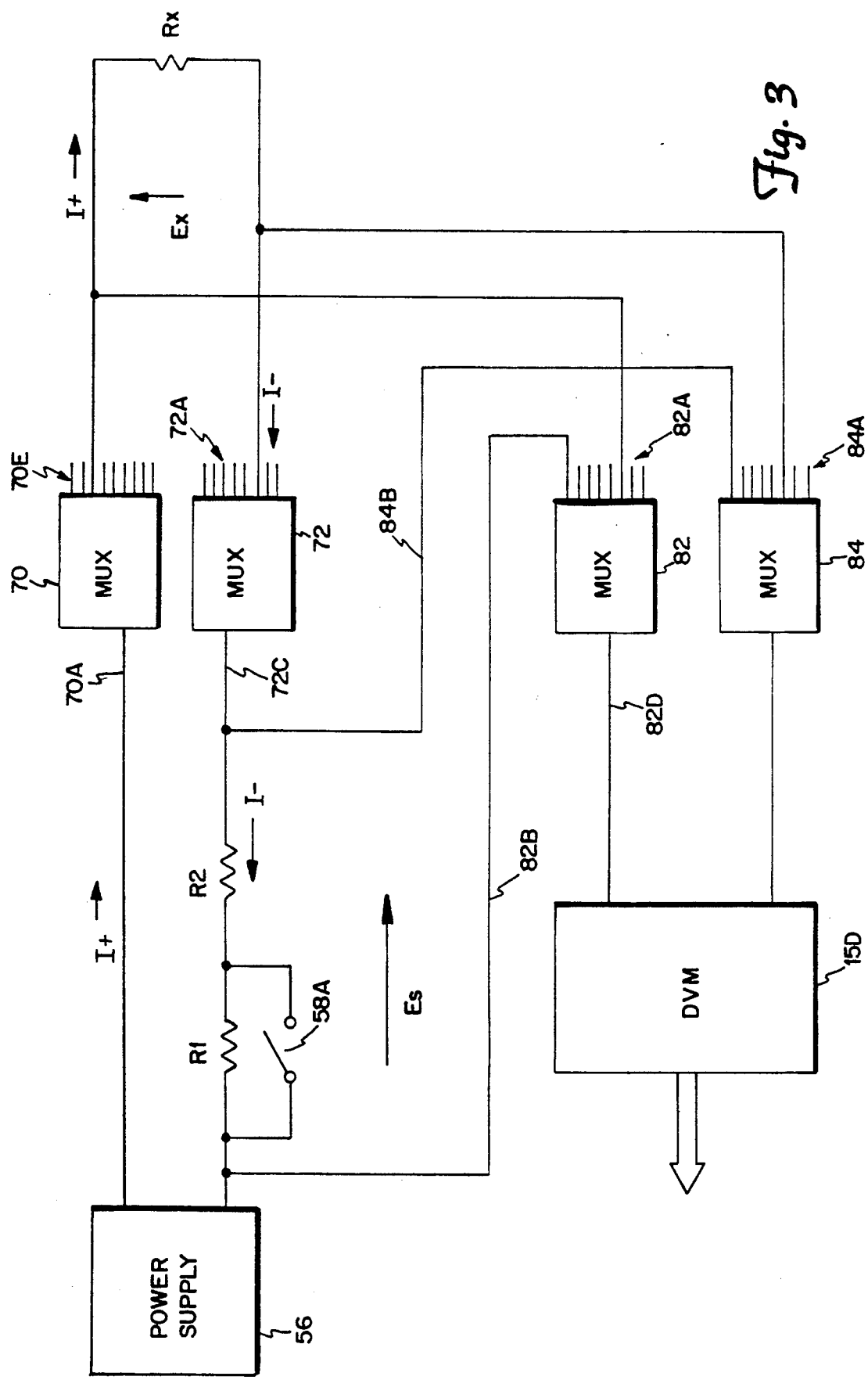
FIG. 3 is a simplified block diagram illustrating the resistance measurement circuitry of the present invention.

FIG. 3 shows a simplified version of the resistance measurement circuitry shown in FIG. 2. In FIG. 3, digital voltmeter 150 represents the circuitry formed by operational amplifier 86, sample/hold and peak-to-peak detector circuitry 88, auto-ranging circuitry 90, and A/D convertor 92. In addition, the diagram is simplified by not showing breakout cable 34, adaptor 42, universal connector 44 and flying lead circuitry 54. The resistance to be measured is referred to $R_x$, the voltage across resistors R1 and R2 is $E_s$, and the voltage across resistor $R_x$ is $E_x$.

During the first measurement, the voltage $E_s$ is read by digital voltmeter 150 through multiplexers 82 and 84. The current $I_x$ is:

$$I_x = \frac{E_s}{R1 + R2} \qquad \text{Eq. 1}$$

In the next step of the process, digital voltmeter 150 reads voltage $E_x$. Since $I_x$ is already known and $E_x$ is measured, resistance $R_x$ can be determined by:

$$R_x = \frac{E_x}{I_x} \qquad \text{Eq. 2}$$

The internal resistances of multiplexers 70 and 72 are not involved in these readings. $E_x$ is measured directly across resistors R1 and R2, and $E_x$ is measured directly across $R_x$. Multiplexers 70 and 72 simply steer the current $I_x$ to and from resistor $R_x$, but are not involved in the voltage measurements from which resistance $R_x$ is derived.

The internal resistances of multiplexers 82 and 84 also do not affect the voltage readings because those resistances (approximately 75 ohms) are very small compared to the high input impedance (typically 10 megohms) of digital voltmeter 150.

The resistance measuring technique of the present invention offers another unique capability for breakout box 10. It is possible, with the present invention, to measure cross-talk between various lines and sensors. This can be done by supplying current through multiplexers 70 and 72 to one set of pins, and then measuring voltages through multiplexers 82 and 84 on different sets of pins.

Although the present invention has been described with reference to preferred embodiments, workers skilled in the art will recognize that changes may be made in form and detail without departing from the spirit and scope of the invention.

What is claimed is:

1. A resistance measurement system for measuring resistances between a plurality of points, the system comprising:
   a power supply;
   resistance means connected in a series circuit with the power supply;
   first solid state multiplexer means having an indefinite internal resistance which varies with temperature, for connecting the series circuit to a selected pair of the points;
   a voltmeter;
   second solid state multiplexer means having an indefinite internal resistance which varies with temperature, for selectively connecting the voltmeter to measure a first voltage across the resistance means and a second voltage between the selected pair of points; and
   means for deriving a resistance value based upon the measured first and second voltages.

2. The system of claim 1 and further comprising:
   a breakout cable for connection to a multiconductor connector of an automotive vehicle, the breakout cable being connected to the first and second multiplexer means.

3. The system of claim 1 wherein the voltmeter is a digital voltmeter which provides digital data representative of the first and second voltages, and wherein the means for deriving a resistance includes a digital computer.

4. The system of claim 3 and further comprising:
   user input means for providing input signals to the computer; and
   display means connected to the computer for displaying results of measurements.

5. The system of claim 3 wherein the computer provides control signals to the first and second multiplexer means.

6. An apparatus for performing a test sequence on a plurality of electrical components of a vehicle of a type having an electronic control module (ECM), the apparatus comprising:
   means for retrieving the test sequence;
   a microcontroller for executing the test sequence;
   means for selectively isolating the ECM from the plurality of electrical connections leading to the plurality of electrical components;
   a current supply comprising:
     a power supply;
     resistance means having a known resistance; and
     first multiplexer means responsive to the microcontroller, for selectively routing a current from the power supply through the resistance means and a pair of electrical connections which lead to a selected electrical component of the plurality of electrical components;
   a voltage measuring circuit comprising:

means for sensing a voltage and providing an output representative of the voltage to the microcontroller; and second multiplexer means responsive to the microcontroller, for selectively connecting the means for sensing a voltage to sense a first voltage across the resistance means and a second voltage across the pair of electrical connections;

means for determining a magnitude of the current based upon the first voltage and the known resistance of the resistance means;

means for determining a condition of the selected electrical component based upon the second voltage and the magnitude of the current; and means for providing an output representative of the condition of the selected electrical component.

7. The apparatus of claim 6 wherein the means for retrieving a test sequence includes:

user input means for providing input to the microcontroller; and data storage means for storing the test sequence.

8. The apparatus of claim 6 wherein the means for selectively isolating the ECM comprises a breakout cable, the breakout cable comprising:

first multipin connector means connectable to the ECM, second multipin connector means connectable to the plurality of electrical components, wherein a plurality of conductors couple the first and second multipin connector means; and third multipin connector means for coupling the plurality of conductors to the first and second multiplexer means.

9. The apparatus of claim 6 wherein the resistance means is comprised of:

first and second resistors connected in series; and shunting means connected in parallel with the first resistor and responsive to the microcontroller, for providing the resistance means with a resistance equal to a resistance of the second resistor, or alternatively, a sum of the resistance of the first resistor and a resistance of the second resistor.

10. The apparatus of claim 6 wherein the first multiplexer means comprises first and second solid state multiplexers, and wherein the second multiplexer means comprises third and fourth solid state multiplexers.

11. The apparatus of claim 6 wherein the means for providing an output comprises a video display.

12. An automotive vehicle test apparatus for testing an electrical system of an automotive vehicle, the electrical system including an electronic control module connected to a plurality of electrical components by a plurality of conductors which form an electronic control module bus for carrying electronic signals between the electronic control module and the plurality of electrical components the test apparatus comprising:

a multipin connector adapted for connecting to the electronic control module bus whereby access to the plurality of conductors is provided to the test apparatus;

a first multiplexer coupled to the multipin connector for selectively providing a current path between a pair of conductors of the electronic control bus;

a second multiplexer coupled to the multipin connector and having a pair of outputs selectively connected across a pair of conductors of the electronic control bus;

means for sensing voltage across the outputs of the second multiplexer and providing a representative digital output; and controller means for instructing the first multiplexer to provide a current path between a pair of conductors of the electronic control bus, instructing the second multiplexer to connect the pair of outputs to a pair of conductors of the electronic control bus, receiving the digital output from the means for sensing voltage, performing a test based upon the digital output and providing an output based upon results of the test.

13. A method for performing a test sequence on a plurality of electrical components in a vehicle of a type having an electronic control module, the method comprising;

retrieving the test sequence;

isolating the electronic control module from the plurality of electrical components;

providing a first select signal to a first multiplexer to route a current through a known resistance and a selected component of the plurality of components;

providing a second select signal to a second multiplexer to sense a first voltage across the known resistance;

providing a third select signal to the second multiplexer to sense a second voltage across the selected component;

determining a magnitude of the current based upon the first voltage and the known resistance;

determining a condition of the selected component based upon the second voltage and the magnitude of the current; and providing an output representative of the condition of the selected electrical component.

14. A method for performing a test sequence on a plurality of electrical components in a vehicle of a type having an electronic control module, the method comprising;

retrieving the test sequence;

isolating the electronic control module from the plurality of electrical components;

providing access to a plurality of electrical connections which lead to the electrical components;

controlling a first multiplexer to route a current through a known resistance and a first set of electrical connections of the plurality of electrical connections;

controlling a second multiplexer to sense a voltage across a second set of electrical connections of the plurality of electrical connections;

deriving a quantity representative of cross-talk based upon the first and second sets and the sensed voltage; and providing an output representative of cross-talk.

15. The method of claim 14 wherein the first set comprises first and second conductors, and wherein the second set comprises third and fourth conductors.

16. The method of claim 14 wherein the first set comprises first and second conductors, and wherein the second set comprises the second conductor and a third conductor.

* * * * *

UNITED STATES PATENT AND TRADEMARK OFFICE
CERTIFICATE OF CORRECTION

PATENT NO. : 5,177,447
DATED : January 5, 1993
INVENTOR(S) : Joseph A. Marino, Raymond H. Niemetschek It is certified that error appears in the above-identified patent and that said Letters Patent is hereby corrected as shown below:

Col. 9, line 56, after "components", insert a ","

Signed and Sealed this

Sixteenth Day of November, 1993

Attest:

BRUCE LEHMAN

Attesting Officer    Commissioner of Patents and Trademarks